United States Patent [19]

Blanken et al.

[11] Patent Number: 5,038,114
[45] Date of Patent: Aug. 6, 1991

[54] CURRENT AMPLIFIER

[75] Inventors: Pieter G. Blanken; Johannes P. M. Verdaasdonk, both of Eindhoven, Netherlands

[73] Assignee: U.S. Philips Corporation, New York, N.Y.

[21] Appl. No.: 493,033

[22] Filed: Mar. 12, 1990

[30] Foreign Application Priority Data

Mar. 15, 1989 [NL] Netherlands ..................... 8900627

[51] Int. Cl.⁵ .............................................. H03F 3/04
[52] U.S. Cl. .................................... 330/288; 330/296
[58] Field of Search ................ 323/315, 316; 330/288, 330/296, 297; 307/296.6

[56] References Cited

U.S. PATENT DOCUMENTS 4,485,351  11/1984  Schemmel et al. ................. 330/288
4,591,804   5/1986  van Tuijl .......................... 330/288

FOREIGN PATENT DOCUMENTS 0055724  10/1984  European Pat. Off. .

Primary Examiner—Steven Mottola
Attorney, Agent, or Firm—Bernard Franzblau

[57] ABSTRACT

A current amplifier has an input terminal (1) for an input current (Iin) to be amplified in order to obtain a first output current (Iout1) at a first output terminal (2) via a first transistor (T1) and a second output current (Iout2) at a second output terminal (8) via a current mirror (6). A diode-connected transistor (T5) is coupled between the emitter of the first transistor and the input terminal of the current amplifier so as to improve the current branching at the input terminal, thereby extending the bandwidth and the output swing of the current amplifier.

17 Claims, 2 Drawing Sheets

CURRENT AMPLIFIER

BACKGROUND OF THE INVENTION

This invention relates to a current amplifier, comprising an input terminal for receiving an input current, a first and a second output terminal for supplying a first and a second output current, respectively, a first transistor whose collector-emitter path is arranged between the first output terminal and the input terminal and whose base is coupled to a bias voltage terminal for receiving a bias voltage. A first current mirror includes an input terminal, an output terminal and a common terminal coupled to the input terminal of the current amplifier, to the second output terminal of the current amplifier, and to a power-supply terminal, respectively. The input terminal of the first current mirror is coupled to the common terminal by at least two series-connected semiconductor junctions.

Such a current amplifier is known from European Patent Specification EP 0,055,724, FIG. 2. In this known current amplifier the input current applied to the input terminal of the current amplifier is branched into two parts. The first part flows to the first output terminal via the emitter-collector path of the first transistor. The second part flows to the input terminal of the first current mirror. The output of the first current mirror is coupled to the second output terminal of the current amplifier. A suitable load is connected to the output terminals in order to obtain the first and the second output currents of the current amplifier. When the input current is zero the magnitude of the quiescent currents flowing in the first and the second output terminal are determined by the bias voltage on the bias-voltage terminal, which is coupled to the base of the first transistor, and by the current transfer of the first current mirror. The emitter line of the first transistor and the series-connected semiconductor junctions of the first current mirror comprise resistors, but these resistors limit the swing of the first and second output currents. When an increasing positive input current is applied to the input terminal of the current amplifier the voltage at this input terminal will increase as a result of an increasing voltage drop across the resistor in the series-connected semiconductor junctions. Since the bias voltage on the base of the first transistor is constant the voltage increase on the input terminal of the current amplifier will cause the current through the first transistor to decrease. For a specific value of the input current the current through the first transistor, and hence the first output current of the current amplifier, will become zero. Conversely, in the case of an increasing negative input current the voltage on the input terminal of the current amplifier will decrease as a result of an increasing voltage drop across the resistor in the emitter line of the first transistor. Eventually the voltage decrease at the input terminal of the current amplifier will cause the series-connected semiconductor junctions of the first current mirror to be turned off, so that the second output current of the current amplifier becomes zero. The swing of the first and the second output current is increased by reducing the values of said resistors or by short-circuiting these resistors. When the resistors are fully short-circuited the output swing is maximal but the portions of the input current which are branched to the emitter of the first transistor and to the input of the first current mirror are now unequal. As a result of this, the relative current variations in the first output current of the current amplifier in response to an input current variation will be substantially larger than the relative current variations in the second output current of the current amplifier. In the case of an adequate drive the minimum value of the first output current may decrease so far that the bandwidth of the first output current decreases because the transition frequency of the first transistor decreases for small currents. The signal distortion in the first output current as a result of the decreasing bandwidth limits the effective swing of the first output current and consequently limits the output swing of the entire current amplifier.

SUMMARY OF THE INVENTION

It is an object of the invention to provide a current amplifier of the type defined in the opening paragraph, having an improved output swing.

To this end, in accordance with the invention, a current amplifier of the type defined in the opening paragraph is characterized in that a number of series-connected semiconductor junctions is arranged between the emitter of the first transistor and the input terminal of the current amplifier, said number being one less than the number of series-connected semiconductor junctions between the input terminal of the first current mirror and the common terminal.

By arranging the semiconductor junctions, which are suitably the base-emitter junctions of diode-connected transistors, in the emitter line of the first transistor the input current is branched in such a way that the product of the instantaneous values of the first and the second output current of the current amplifier remains substantially constant. The relative current variations in the first output current are now in better compliance with those of the second output current. Both output currents now have a comparable bandwidth and signal distortion. Therefore, in comparison with the prior art current amplifier, a larger current can be applied to the input of the current amplifier in accordance with the invention without the first and the second output currents being distorted.

The first current mirror may be constructed in various ways depending on the requirements imposed on the current amplifier. An embodiment of a current amplifier in accordance with the invention is characterized in that the input terminal of the first current mirror is coupled to the common terminal via a series arrangement of the base-emitter junction of a second transistor and the collector-emitter path of a diode-connected third transistor and also via the collector-emitter path of a fourth transistor whose base is coupled to the base of the third transistor. The output terminal of the first current mirror is coupled to the collector of the second transistor and the emitter of the first transistor is couple do the input terminal of the current amplifier via the base-emitter junction of a diode-connected fifth transistor.

The second, the third and the fourth transistor constitute a current mirror having satisfactory high-frequency characteristics and which is also accurate enough, so that it is very suitable for use in the current amplifier.

Another embodiment of the current amplifier in accordance with the invention is characterized in that the first and the second output terminal of the first current amplifier are coupled to respectively an input terminal and an output terminal of a second current mirror.

By adding the second current mirror the difference current available on the second output terminal is linearly proportional to the input current if the current mirrors have the same current transmission.

The bias voltage on the base of the first transistor dictates the quiescent currents in the first and the second output terminals. The bias-voltage source should minimize the a.c. impedance at the base of the first transistor in order to prevent the high-frequency characteristics of this transistor, which operates in common-base arrangement, from being adversely affected. To this end an embodiment of the current amplifier in accordance with the invention is characterized in that the current amplifier further comprises a bias-voltage source comprising a third current mirror having an input terminal coupled to the bias voltage terminal, having an output terminal, and having a common terminal coupled to the power-supply terminal. A sixth transistor is provided having its emitter coupled to the bias-voltage terminal and having its base coupled to a current source and to the output terminal of the third current mirror. A number of semiconductor junctions of the third current mirror are arranged in series between the input terminal of the third current mirror and the common terminal, which number is equal to the sum of the number of semiconductor junctions between the bias-voltage terminal and the input terminal of the current amplifier and number of semiconductor junction between the power supply terminal and the input terminal of the current amplifier.

The current flowing into the input terminal of the third current mirror is proportional to the current form the current source. Since the number of base-emitter junctions between the power supply terminal and the bias-voltage terminal in the bias-voltage source and in the current amplifier is the same, the quiescent-currents in the first and the second output currents will also be proportional to said current. The output impedance at the bias-voltage terminal is low because voltage variations on the emitter of the sixth transistor are counteracted via the third current mirror by oppositely directed voltage variations on the base of the sixth transistor.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
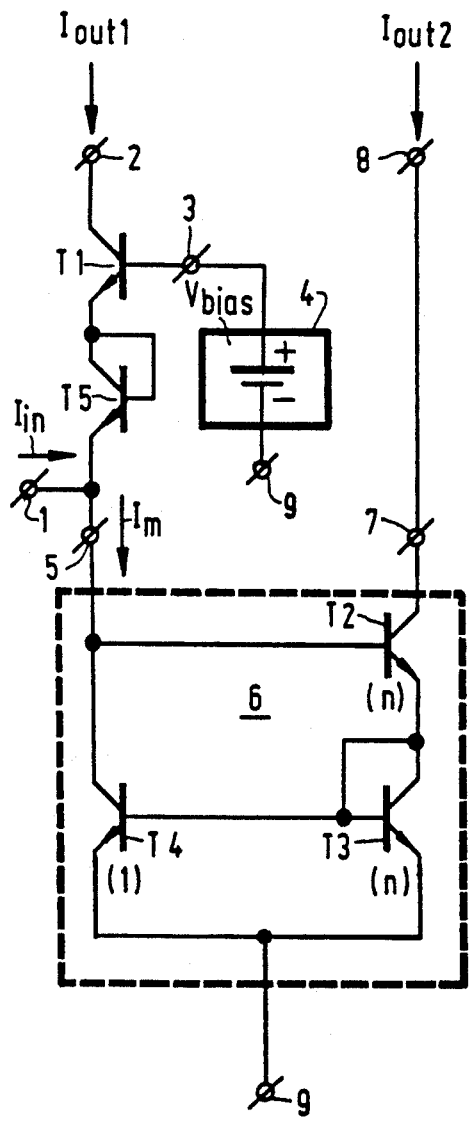
FIGS. 1 and 2 show embodiments of a current amplifier in accordance with the invention.

FIG. 1 shows the circuit diagram of an embodiment of a current amplifier in accordance with the invention. A series arrangement of the collector-emitter paths of the transistors T5 and T1 connects the input terminal to a first output terminal 2 of the current amplifier. The transistor T5 is connected as a diode by interconnecting its collector and base. The transistor T1 has its base coupled to a bias-voltage terminal 3 which is connected to a bias-voltage source 4. The input terminal 1 is also coupled to an input terminal 5 of a first current mirror 6, which has an output terminal 7 coupled to a second output terminal 8 of the current amplifier. The first current mirror 6 comprises the transistors T2, T3 and T4. The collector-emitter paths of the transistors T2 and T3 are arranged in series between the output terminal 7 of the first current mirror 6 and a power-supply terminal 9. The transistor T2 has its base connected to the input terminal 5 of the first current mirror 6. The collector and the base of the transistor T3 are interconnected and are also connected to the base of the transistor T4, whose base-emitter junction is arranged in parallel with the base-emitter junction of the transistor T3. The collector of the transistor T4 is connected to the input terminal 5 of the first current mirror 6. The ratio between the emitter areas of the transistors T3 and T4 is n:1, which defines the current transmission of the current mirror 6. The current transmission is the ratio between the currents in the output terminal 7 and the input terminal 5 of the current mirror 6. The emitter areas of the transistors T1 and T5 are selected to be equal. This also applies to the emitter areas of the transistors T2 and T3.

An input current Iin is applied to the input terminal 1 of the current amplifier and divides into a current Iout1 to the output terminal 2 of the current amplifier via the transistors T5 and T1 and a current Im to the input terminal 5 of the current mirror 6. The current Im gives rise to a current which is n times as large at the output terminal 7 of the current mirror 6, which also flows through the output terminal 8 of the current amplifier. The following relationships are valid:

$$Iout2 = n*Im \quad (1)$$

$$Iin = Im - Iout1 \quad (2)$$

If the input current Iin is zero the magnitude of the quiescent currents flowing into the output terminals 2 and 8 depends on the bias voltage Vbias from the bias-voltage source 4. If the quiescent value of Iout1 is equal to Iq the quiescent current of Iout2 will be equal to n * Iq.

The relationship between the base-emitter voltage Vbe of a transistor and the current I through the transistor is given by the well known diode equation:

$$Vbe = VT*ln(I/Ic) \quad (3)$$

where VT and Ic are constants. Ic is the saturation current, which is proportional to the emitter area of the transistor. When their base currents are ignored the currents through the transistors T1 and T5 are equal, to that the their base-emitter voltages will also be equal. Consequently, the base-emitter voltages of the transistors T2 and T3 are also equal to each other. The sum of the base-emitter voltages of the transistors T1, T5, T2 and T3 is equal to the bias voltage Vbias:

$$Vbe1 + Vbe5 + Vbe2 + Vbe3 = Vbias \quad (4)$$

Using the diode equation (3) this yields:

$$VT*\{2*ln(Iout1/Ic) + 2*ln(Inout2/(n*Ic))\} = Vbias \quad (5)$$

Equation (5) can be reduced to:

$$Iout1 * Iout2 = C \quad (6)$$

where C is a constant which can be computed by assuming that the input current Iin is zero. In that case Iout1 = Iq and Iout2 = n*Iq, so that:

$$Iout1 * Iout2 = n*Iq*Iq \quad (7)$$

Consequently, the product of the output currents of the current amplifier is constant. For example, if Iout1 becomes ten times as large, Iout2 becomes ten times as small and vice versa. It is assumed, by way of example, that the current transmission of the current mirror 6 is n=3 and that the bias voltage Vbias is selected in such a way that the quiescent current Iq in Iout1 is 1 mA. The quiescent current component in Iout2 is therefore 3 mA. It is further assumed that the input current Iin flows into the current amplifier and has a value such that Iout2 becomes ten times as large as its quiescent current, i.e. 30 mA. From equation (7) it now follows that Iout1 becomes ten times as small as its quiescent current, i.e. 0.1 mA. The input current Iin can be computed by means of equations (1) and (2) and is 9.9 mA. A similar calculation, but now for an oppositely directed input current Iin causing an Iout2 which is ten times as small as the quiescent current of Iout1, i.e. 0.3 mA, yields a value of 10 mA for the current Iout1 and a value of −9.9 mA for the current Iin.

The importance of the diode connected transistor T5 can now be understood by leaving out Vbe5 in equations (4), (5), (6) and (7). The product of Iout1 and the square of Iout2 then appears to remain constant:

$$Iout1 * Iout2 * Iout2 = K = n*n*Iq*Iq*Iq \quad (8)$$

where K is a constant. Making Iout2 ten times as large now results in Iout1 being reduced to one hundredth. If Iout2 increases to 30 mA Iout1 will decrease to 0.01 mA for an input current Iin of approximately 10 mA. An oppositely directed input current Iin of −10 mA produces a current Iout1 of approximately 10 mA and a current Iout2 of approximately 0.95 mA. It is found that without the transistor T5 a specific variation of Iin, which in the present example is approximately +10 mA, results in a substantially larger current variation in Iout1 than in Iout2. The minimum current in Iout1 for equal input-current conditions in Iin in the absence of the transistor T5 is substantially smaller (in the present example approximately 10 times) than in the case where the transistor T5 is present. The variations of the minimum value of Iout2 are substantially smaller (in the present example approximately three times). The minimum current through the transistor T1 becomes so small relative to the minimum current through the transistors T2 and T3 that the decrease in transition frequency as a result of the decreasing collector current in the transistor T1 manifests itself in the output current Iout1. The bandwidth of the output current Iout1 decreases, resulting in signal distortion which is not yet the case in the output current Iout2.

By adding the diode-connected transistor T5 the relative current variations in the transistor T1 become substantially smaller and are in closer conformity with those in the transistors T2 and T3. The ratios between the extreme values and the quiescent value is now the same in both output currents so that these currents will also exhibit a similar high-frequency signal behaviour. If for the remainder the input current conditions are the same the distortion in the output current Iout1 is therefore smaller. However, if for the remainder the high frequency signal distortion in Iout1 remains the same, it is alternatively possible to reduce the quiescent current Iq in order to reduce the current consumption of the current amplifier.

Figure 2:
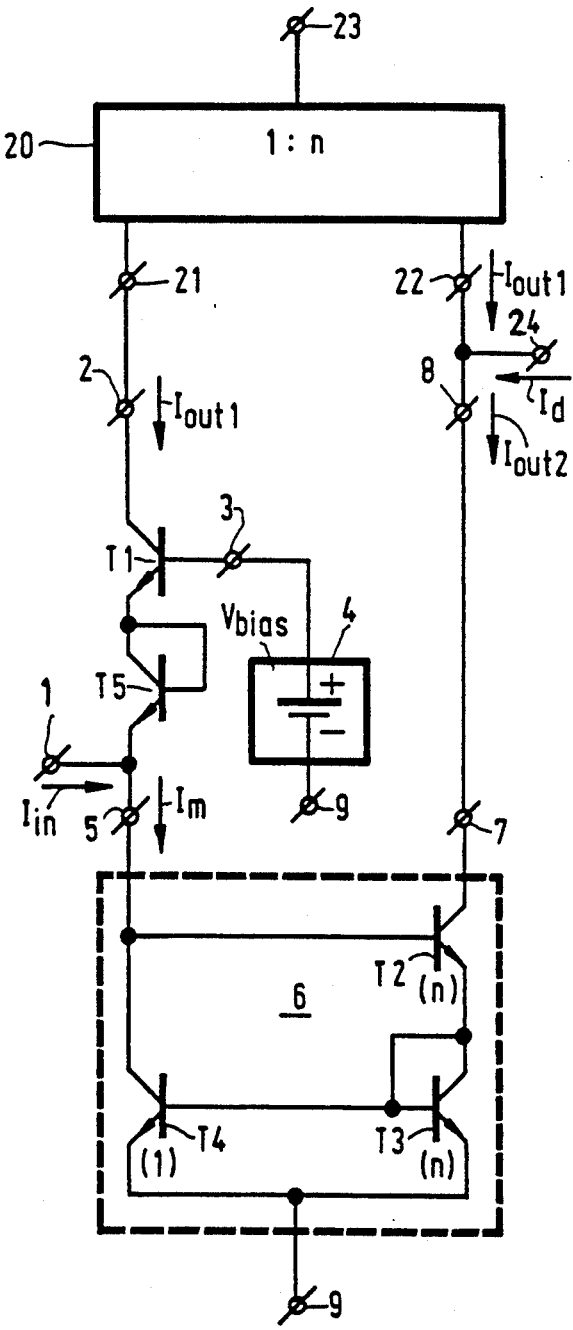

FIG. 2 shows a second embodiment of a current amplifier in accordance with the invention. In this Figure corresponding parts bear the same reference numerals as in FIG. 1. A second current mirror 20, which may be of any arbitrary type, is coupled to the output terminals 2 and 8 of the current amplifier in FIG. 1. The second current mirror 20 has an input terminal 21 coupled to the output terminal 2 and has an output terminal 22 coupled to the output terminal 8. Coupling may be effected directly or via a suitable impedance. The second current mirror 20 further comprises a common terminal 23 for applying a suitable supply voltage. On an output terminal 24, which is connected t **to the output terminal 22 of the second current mirror 20, a difference current, Id, is available whose magnitude is equal to n * Iin if the current transmission of the second current mirror 20 is selected to equal that of the first current mirror 6. This is because the difference current Id complies with:

$$Id = n*Iout1 - Iout2 \quad (9)$$

By means of equation (2), using equation (1), the ratio Id/Iin may then be written as follows:

$$Id/Iin = (n*Iout1 - Iout2)/((Iout2/n) - Iout2) = n \quad (10)$$

The current amplifier shown in FIG. 2 has a linear current gain Id/Iin which is independent of the current branching at input terminal 1. Again the diode-connected transistor T5 limits the current variation in the transistor T1 and contributes to a larger linear output swing without a loss of bandwidth in Iout1 and n*Iout1, and consequently, in the difference current Id. Therefore, this embodiment is very suitable for use as a class-AB current amplifier having a low quiescent current, a large output swing and a large bandwidth.

Figure 3A:
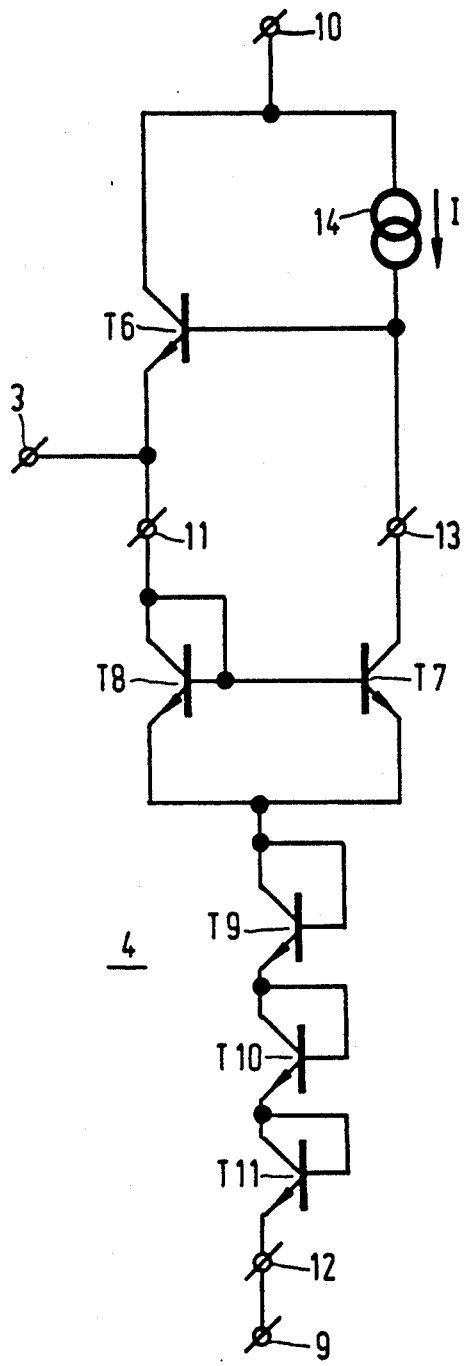
FIGS. 3a and 3b show examples of bias-voltage sources of a current amplifier in accordance with the invention.

FIG. 3 shows two examples of the bias-voltage source 4. In this Figure reference numerals corresponding to those in FIG. 1 have the same meaning. In the example shown in FIG. 3a the emitter of a transistor T6 is coupled to the bias-voltage terminal 3 and to an input terminal 11 of a third current mirror comprising the transistors T7 to T11. The input terminal 11 is connected to the short-circuited collectorbase junction of the transistor T8, whose base-emitter junction is arranged in parallel with that of the transistor T7. The collector of the transistor T7 is connected to an output terminal 13 of the third current mirror, which is in turn connected to the base of the transistor T6 and to a current source 14. The collector of T6 and the current source 14 are connected to a further power-supply terminal 10. The node to which the emitters of the transistors T7 and T8 are couple dis connected to a common terminal 12 of the third current mirror via an arrangement of three diode-connected transistors T9, T10 and T11. The common terminal 12 is connected to the power-supply terminal 9. The number of base-emitter junctions between the bias-voltage terminal 3 and the power-supply terminal 9 is four. This number is the same as in the circuit shown in FIG. 1. This transistor configuration enables the quiescent currents in the output terminals 2 and 8 of the circuit shown in FIG. 1 to be substantially temperature-independent and proportional to the current I from the current source 14.

The transistor T1 of the current amplifier in FIG. 1 is operated in a common base arrangement. A low impedance at the bias-voltage terminal promotes the high-frequency characteristics of the transistor T1. The output impedance of the bias voltage source 4 should therefore be as low as possible. In the circuit shown in FIG. 3a this is achieved by means of a negative-feedback loop from the emitter of the transistor T6 to the base of T6 via the transistors T8 and T7. A voltage increase on the emitter of the transistor T6 results in an increase of the collector current in the transistor T8. The resulting collector current increase in the transistor T7 causes the voltage on the base of the transistor T6 to decrease, thereby counteracting the voltage increase on the emitter of T6.

Figure 3B:
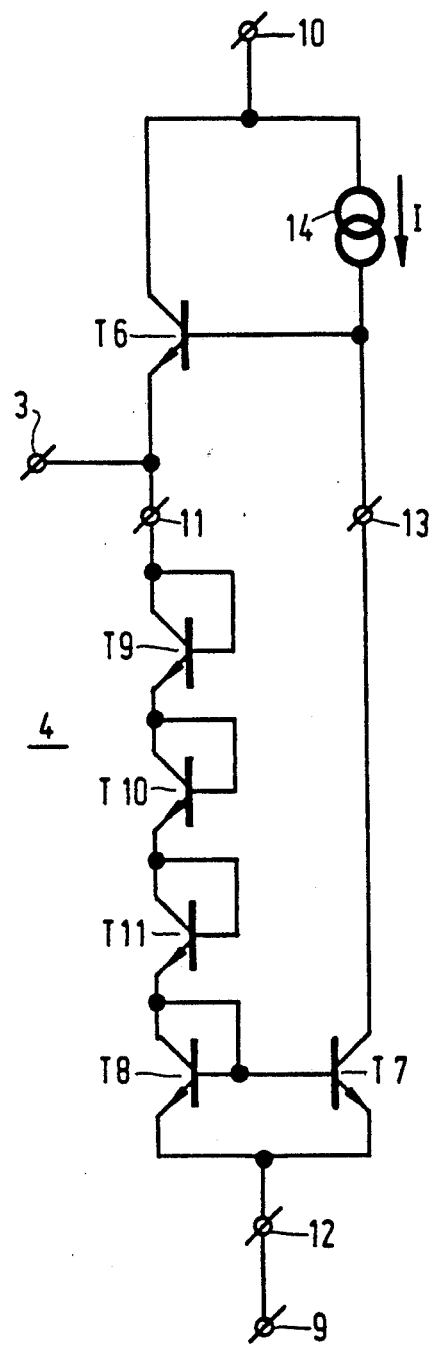

The bias-voltage source 4 shown in FIG. 3b is a modification of that shown in FIG. 3a, corresponding parts bearing the same reference numerals. The arrangement comprising three diode-connected transistors T9, T10 and T11 is now arranged between the emitter of the transistor T6 and the collector of the transistor T8 instead of between the common node between the emitters of T7 and T8 and the common terminal 12. The circuit operates in a manner similar to that shown in FIG. 3a.

The invention is not limited to the embodiments shown herein. Instead of the NPN transistors shown, PNP transistors may be employed. If the first current mirror 6 of the current amplifiers in FIGS. 1 and 2 is of a type in which the number of base-emitter junctions arranged between the input terminal 5 and the power-supply terminal 9 is larger than two, as shown, an equal number of additional diode-connected transistors should be arranged in series with the transistor T5 in order to achieve the favourable current branching at the input terminal 1. In that case the number of diode connected transistors between the bias-voltage terminal 3 and the common terminal 12 in the bias-voltage source 4 should also be adapted in such a way that the number of base-emitter junctions between the terminals 3 and 9 in the bias-voltage source is the same as in the current amplifiers shown in FIGS. 1 and 2.

The third current mirror T7–T11 in the bias voltage source 4 can also be realised in a different way. This is, for example, possible by means of a current mirror of the same type as the first current mirror 6 shown in FIGS. 1 and 2. In that case the arrangement of diode-connected transistors should be reduced by one in order to maintain the number of base-emitter junctions between the input terminal 11 and the common terminal 12 of the third current mirror constant.

The transistor T6 may be a compound transistor, for example, a Darlington transistor. It is alternatively possible to employ a transistor of a unipolar type (FET) for the transistor T6. Moreover, an impedance may be arranged between the emitter of the transistor T6 and the bias-voltage terminal 3.

The current mirror 20 need not comprise transistors of the same type as in the remainder of the current amplifier. For example, it is also possible to utilize MOS transistors. Moreover, the bias-voltage source 4 may be constructed in any other known manner.

We claim:

1. A current amplifier comprising: an input terminal for receiving an input current, a first and a second output terminal for supplying a first and a second output current, respectively, a first transistor whose collector-emitter path is coupled between the first output terminal and the input terminal and whose base is coupled to a bias voltage terminal for receiving a bias voltage, a first current mirror having an input terminal, an output terminal and a common terminal, which are coupled to the input terminal of the current amplifier, to the second output terminal of the current amplifier, and to a power-supply terminal, respectively, the input terminal of the first current mirror being coupled to the common terminal by at least two series-connected semiconductor junctions, characterized in that a number of series-connected semiconductor junctions is coupled between the emitter of the first transistor and the input terminal of the current amplifier with at least one said semiconductor junction connected in series aiding relationship to the base/emitter junction of said first transistor, said number being one less than the number of series-connected semiconductor junctions between the input terminal of the first current mirror and the common terminal.

2. A current amplifier as claimed in claim 1, wherein the input terminal of the first current mirror is coupled to the common terminal via a series arrangement of the base-emitter junction of a second transistor and the collector emitter path of a diode-connected third transistor and also via the collector-emitter path of a fourth transistor whose base is coupled to the base of the third transistor, the output terminal of the first current mirror being coupled to the collector of the second transistor, and wherein at least one of said number of series-connected semiconductor junctions comprise the base-emitter junction of a diode-connected fifth transistor.

3. A current amplifier as claimed in claim 2, wherein the first and the second output terminal of the current amplifier are coupled to an input terminal and an output terminal, respectively, of a second current mirror.

4. A current amplifier as claimed in claim 3, wherein the first current mirror and the second current mirror have substantially the same current transmission from the input terminal to the output terminal.

5. A current amplifier as claimed in claim 3, wherein the current amplifier further comprises a bias-voltage source comprising; a third current mirror having an input terminal coupled to the bias voltage terminal, an output terminal, and a common terminal coupled to the power-supply terminal, a sixth transistor having its emitter coupled to the bias-voltage terminal and having its base coupled to a current source and to the output terminal of the third current mirror, said third current mirror having a number of semiconductor junctions connected in series between the input terminal of the third current mirror and its common terminal, which number is equal to the sum of the number of semiconductor junctions between the bias-voltage terminal and the input terminal of the current amplifier and the semiconductor junctions between the power supply terminal and the input terminal of the current amplifier.

6. A current amplifier as claimed in claim 5, the output terminal of the third current mirror is coupled to a collector of a seventh transistor whose base-emitter junction is connected in parallel with a base emitter junction of a diode-connected eighth transistor, which has its collector coupled to the input terminal of the third current mirror, a common node between the emitters of the seventh and the eighth transistor being coupled to the common terminal of the third current mirror.

7. A current amplifier as claimed in claim 6, wherein the common node is coupled to the common terminal of the third current mirror via an arrangement of a plurality of series-connected collector emitter paths of a plurality of diode-connected transistors.

8. A current amplifier as claimed in claim 6, wherein the collector of the eighth transistor is coupled to the input terminal of the third current mirror via a plurality of series connected collector-emitter paths of a plurality of diode-connected transistors.

9. A current amplifier as claimed in claim 8 comprising three said series connected collector-emitter paths.

10. A current amplifier as claimed in claim 1, wherein the first and the second output terminal of the current amplifier are coupled to an input terminal and an output terminal, respectively, of a second current mirror.

11. A current amplifier as claimed in claim 1, wherein the current amplifier further comprises a bias voltage source comprising; a second current mirror having an input terminal coupled to the bias voltage terminal, an output terminal, and a common terminal coupled to the power supply terminal, a second transistor having its emitter coupled to the bias voltage terminal and having its base coupled to a current source and to the output terminal of the second current mirror, said second current mirror having a number of semiconductor junctions connected in series between the input terminal of the second current mirror and its common terminal, said number being equal to the sum of the number of semiconductor junctions between the bias voltage terminal and the input terminal of the current amplifier and the number of semiconductor junctions between the power supply terminal and the input terminal of the current amplifier.

12. A current amplifier as claimed in claim 11, wherein the output terminal of the second current mirror is coupled to a collector of a third transistor whose base-emitter junction is connected in parallel with a base-emitter junction of a diode-connected fourth transistor, which has its collector coupled to the input terminal of the second current mirror, a common node between the emitters of the third and fourth transistors being coupled to the common terminal of the second current mirror.

13. A current amplifier as claimed in claim 12, wherein the common node is coupled to the common terminal of the second current mirror via an arrangement of a plurality of series connected collector-emitter paths of a plurality of diode-connected transistors.

14. A current amplifier as claimed in claim 13, wherein the collector of the fourth transistor is coupled to the input terminal of the second current mirror via a plurality of series connected collector-emitter paths of a plurality of diode-connected transistors.

15. A current amplifier as claimed in claim 2, further comprising a bias voltage source which includes a second current mirror having an input terminal coupled to the bias voltage terminal, an output terminal, and a common terminal coupled to the power supply terminal, a sixth transistor having its emitter coupled to the bias voltage terminal and having its base coupled to a current source and to the output terminal of the second current mirror, a number of semiconductor junctions connected in series between the input terminal of the second current mirror and its common terminal, said number being equal to the sum of the number of semiconductor junctions between the bias voltage terminal and the input terminal of the current amplifier and the semiconductor junctions between the power supply terminal and the input terminal of the current amplifier.

16. A current amplifier comprising:
an input terminal,
first and second output terminal,
means including a number of series-connected semiconductor junctions in series circuit with a first transistor for coupling said input terminal to the first output terminal, means coupling a control electrode of the first transistor to a source of bias voltage,
a current mirror having an input terminal, an output terminal and a common terminal, a second transistor coupled between the current mirror input terminal and common terminal, a third transistor and a diode-connected fourth transistor coupled in series between the current mirror output terminal and common terminal and with a control electrode of the third transistor connected to the current mirror input terminal and a control electrode of the second transistor coupled to the fourth transistor whereby the current mirror input terminal is coupled to the common terminal via at least two series-connected semiconductor junctions, and
means coupling the current mirror input terminal, output terminal and common terminal to the current amplifier input terminal, the current amplifier output terminal and to a power supply terminal, respectively, and wherein
said number of series-connected semiconductor junctions is one less than the number of series-connected semiconductor junctions present between the current mirror input terminal and common terminal.

17. A current amplifier as claimed in claim 16, wherein the current amplifier further comprises a bias voltage source comprising; a second current mirror having an input terminal coupled to a terminal of the bias voltage source, an output terminal, and a common terminal coupled to the power supply terminal, a fifth transistor coupled to the bias voltage terminal and to a further power supply terminal and having its control electrode coupled to a current source and to the output terminal of the second current mirror, a number (X) of semiconductor junctions in the second current mirror being connected in series between the input terminal of the second current mirror and its common terminal, said number (X) being equal to the sum (S) of the number (A) of semiconductor junctions between the bias voltage terminal and the input terminal of the current amplifier and the number (B) of semiconductor junctions between the power supply terminal and the input terminal of the current amplifier, i.e. $X=S=A+B$.

* * * * *